United States Patent [19]
Avanzino et al.

[11] Patent Number: 5,837,618
[45] Date of Patent: Nov. 17, 1998

[54] UNIFORM NONCONFORMAL DEPOSITION FOR FORMING LOW DIELECTRIC CONSTANT INSULATION BETWEEN CERTAIN CONDUCTIVE LINES

[75] Inventors: Steven Avanzino, Cupertino; Darrell Erb, Los Altos; Robin Cheung, Cupertino, all of Calif.

[73] Assignee: Advanced Micro Devices, Inc., Sunnyvale, Calif.

[21] Appl. No.: 906,772

[22] Filed: Aug. 6, 1997

Related U.S. Application Data

[62] Division of Ser. No. 481,906, Jun. 7, 1995.
[51] Int. Cl.⁶ ................................................. H01L 21/56
[52] U.S. Cl. ..................... 438/778; 438/624; 438/631; 438/619; 438/782; 438/763
[58] Field of Search ..................... 438/624, 631, 438/619, 782, 763

[56] References Cited

U.S. PATENT DOCUMENTS

| | | |
|---|---|---|
| 4,654,269 | 3/1987 | Lehrer . |
| 5,124,014 | 6/1992 | Foo et al. . |
| 5,132,774 | 7/1992 | Matsuura et al. . |
| 5,275,977 | 1/1994 | Otsubo et al. . |
| 5,310,700 | 5/1994 | Lien et al. . |
| 5,319,247 | 6/1994 | Matsuura . |
| 5,416,355 | 5/1995 | Kudoh . |
| 5,523,615 | 6/1996 | Cho et al. . |
| 5,531,834 | 7/1996 | Ishizuka et al. ..................... 118/723 I |
| 5,534,731 | 7/1996 | Cheung . |
| 5,539,243 | 7/1996 | Matsuki . |
| 5,545,919 | 8/1996 | Ueda et al. . |
| 5,587,344 | 12/1996 | Ishikawa ................................ 438/786 |
| 5,605,867 | 2/1997 | Sato et al. ............................... 438/790 |
| 5,691,573 | 11/1997 | Avanzino et al. ...................... 257/758 |
| 5,716,888 | 2/1998 | Lur et al. ................................ 438/619 |

FOREIGN PATENT DOCUMENTS

| | | |
|---|---|---|
| 62-5643 | 1/1987 | Japan . |
| 62-193265 | 8/1987 | Japan . |
| 63-179548 | 7/1988 | Japan . |
| 2-86146 | 3/1990 | Japan . |
| 5-211142 | 8/1993 | Japan . |

*Primary Examiner*—Charles L. Bowers, Jr.
*Assistant Examiner*—T. Nguyen
*Attorney, Agent, or Firm*—Foley & Lardner

[57] ABSTRACT

A method of forming low dielectric insulation between those pairs of conductive lines, of a level of interconnection for integrated circuits, having a gap of about 0.5 microns or less by depositing a nonconformal source with a poor step function for the insulating material, such as silane ($SiH_4$) as the silicon (Si) source for silicon dioxide ($SiO_2$), so as to create, in the gap, a large void whose dielectric constant is slightly greater than 1. After the formation of the void in the 0.5 microns or less gaps, the deposition of the nonconformal source material is stopped and a flowable insulating material, such as spin on glass, is coated on nonconformal insulating material to fill the remaining gaps. After etching the surfaces of the nonconformal and flowable insulating materials, another insulating layer is deposited and planarized to the desired overall thickness of the insulation. Alternatively, a thin conformal insulating layer is first deposited as a liner on the conductive lines. The resulting structure of the interconnection level comprises a layer of insulation between and on the conductive lines with the dielectric constant of the insulation between the pairs of conductive lines with gap of 0.5 or less being, in combination with the void, at least about 3 or lower, and substantially all of the remaining gaps are filled with the flowable insulating material and are void free with a composite dielectric constant of greater than about 3.5.

9 Claims, 4 Drawing Sheets

FIG. 1
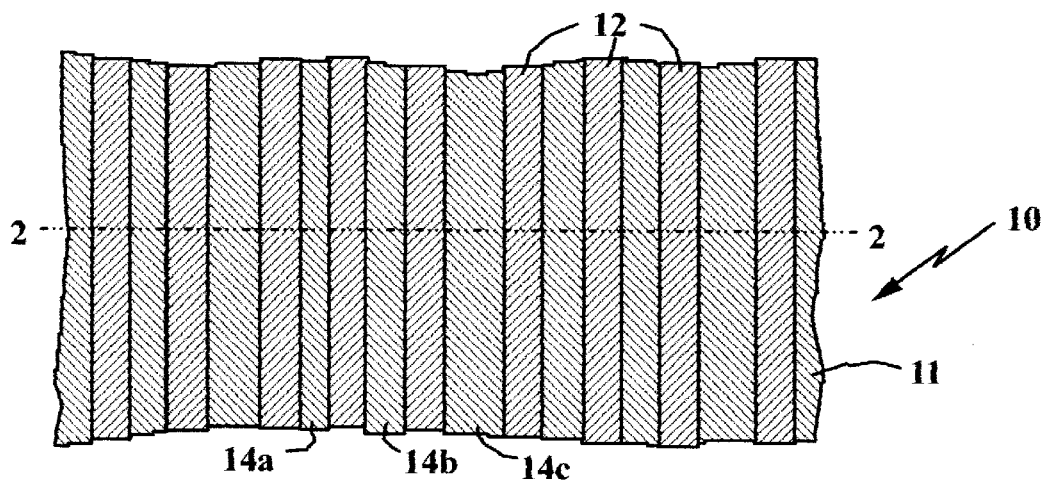
FIG. 2
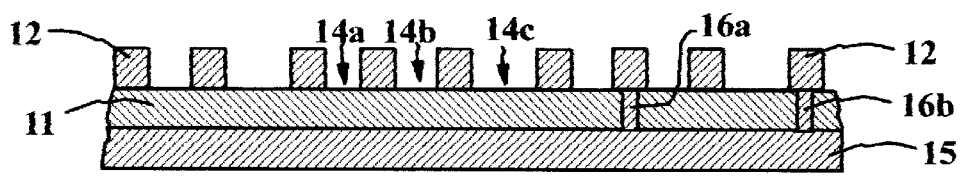
FIG. 3 (Prior Art)
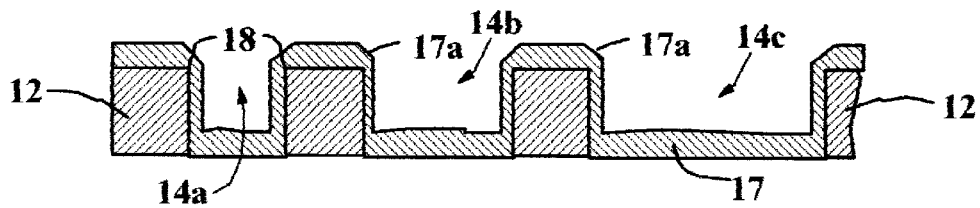
FIG. 4 (Prior Art)
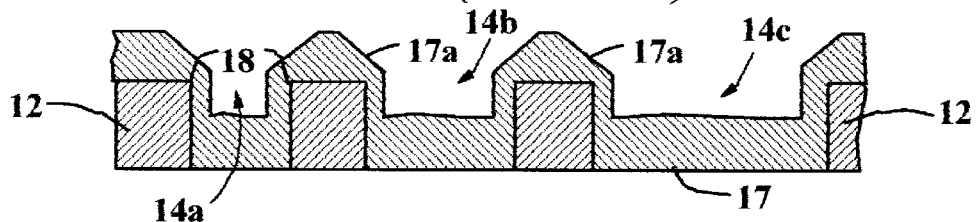
FIG. 5 (Prior Art)
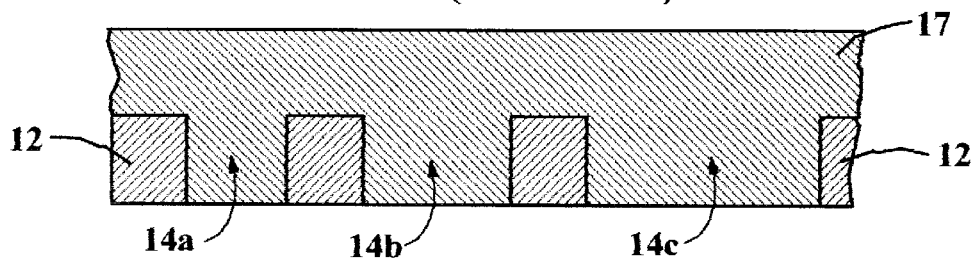

UNIFORM NONCONFORMAL DEPOSITION FOR FORMING LOW DIELECTRIC CONSTANT INSULATION BETWEEN CERTAIN CONDUCTIVE LINES

CROSS REFERENCES TO RELATED APPLICATIONS

This is a Divisional application of U.S. Ser. No. 08/481,906 filed on Jun. 7, 1995. This application is related to U.S. patent application Ser. No. 08/478,315, entitled bias plasma deposition for selective low dielectric insulation, filed on an even date herewith; and U.S. patent application Ser. No. 08/481,030, entitled selective nonconformal deposition for forming low dielectric insulation between certain conductive lines also filed on an even date herewith.

BACKGROUND OF THE INVENTION

This invention relates to the fabrication of integrated circuit semiconductor devices and, more particularly, to forming an insulating layer on and between metal conductive lines which provide an interconnection between the active and/or passive elements of the integrated circuit and between other levels of interconnections.

In very large scale integrated (VLSI) circuit devices, several wiring layers are required to connect together the active and/or passive elements in a VLSI semiconductor chip. The interconnection structure consists of thin conductive lines separated by insulation in one layer or level and connected through vias or studs from contacts of the elements of the semiconductor chip or to a similar layer in another level of interconnections. This interconnection structure is similar to a transmission line in that there is a propagation delay of the signals being transmitted in these wiring layers. The delay is referred to as RC delay because it is a result of the resistance (R) of the material of the wire and the capacitance (C) between adjacent wires. With the trend of higher and higher levels of integration in semiconductor devices to ultra large scale integrated (ULSI) circuits, the space or gap between the wires or conductive lines to be filled with insulation is becoming extremely narrow between some of the conductive lines, such as about 0.5 microns and smaller. Such a narrow space or gap between conductive lines increases the capacitance and places greater demands on the insulating properties of the insulation between the conductive lines. Capacitance (C) is proportional to the product of dielectric constant (DC) of the insulating material times the area (A) of the opposing faces of the conductive line divided by the distance (D) between the conductive lines. With a decrease in distance (D), the capacitance (C) increases. Since signal delay of signal transmitted on the conductive line is controlled by the RC constant, an increase in capacitance (C) degrades the performance of the integrated circuit.

At the present state of the art, the insulating material used to fill these gaps is a silicon compound, such as silicon dioxide, which has a dielectric constant (DC) of between 3.5 and 4.0. A vacuum has a perfect dielectric constant (DC) and is the basis for the measurement of the dielectric constant of materials. For example, air and other insulating gases have a dielectric constant (DC) of about 1 or very slightly greater than 1. The use of insulating material with dielectric constants (DC) lower than 3.5 in the narrow gap will lower the capacitance (C) and offset the increase caused by the smaller distance (D) between adjacent conductive lines. Attempts have been made to use organic insulating materials, such as polyimides which have a DC of between 3.2–3.4, but are hydroscopic and any absorbed moisture can potentially cause corrosion of metal lines.

In addition to the demands placed on the insulating property of the insulation between the conductive lines, these narrow gaps of about 0.5 microns and smaller make it much more difficult to deposit the insulating material into the gaps so that the gaps may not be completely and properly filled. In addition, when the height of the conductive line is increased, it makes it more difficult to fill, especially when the aspect ratio is 2 to 1 or greater with a gap distance of 0.5 micron or smaller. Aspect ratio, is the height (h) of the conductive line divided by the distance (d) or gap between the conductive lines. It is pointed out in U.S. Pat. No. 5,124,014 to Pang-Dow Foo et al. that when the gap or distance (d) is less than the height (h) of the conductive line, it is difficult to fill uniformly. This patent states that the top tends to accumulate deposited material, growing shoulders that may eventually close off before the bottom is filled, leading to the formation of voids in the deposited material. U.S. Pat. No. 5,275,977 to Otsubo et al. confirms this problem and sets the same objective for their process as Pang-Dow Foo et al set for theirs; namely, the formation of the insulating film free of voids. This patent discloses the combination of chemical vapor deposition (CVD) and etching a silicon dioxide film ($SiO_2$) using tetraethylorthosilicate (TEOS) [$(Si(OC_2 H_5)_4$ as the source silicon gas and oxygen ($O_2$) for deposition of $SiO_2$ and carbon tetrafluoride ($CF_4$)as the etching gas. With TEOS as the source gas, the deposited $SiO_2$ films are conformal in that the deposition follows the contour of the surface on which it is being deposited. This patent also suggests the use of other source gases, one of which is silane ($SiH_4$). However, other than this suggestion, no description is given for forming an insulating layer between and on the conductive lines with $SiH_4$ as the source. The Pang-Dow Foo et al. patent describes the use of an electron cyclotron resonance (ECR) plasma reactor, which can be operated to both deposit and sputter etch either simultaneously or sequentially, to deposit high quality silicon dioxide layers which are void-free. The deposition of $SiO_2$ occurs in a vertical direction while the sputtering is angle dependent with its highest yield being at 45°. Buildup of insulating material on the shoulders at the top of the conductive lines include material at a 45° angle and this material receives the greatest etching. Instead of $SiH_4$, either TEOS or tetramethycyclosiloxane (TMCTS) is used as the silicon containing source gases. Both of these source gases produce conformal films. This patent states that as the aspect ratio approaches and exceeds unity, it becomes more difficult to deposit void-free oxide. To prevent voids in the insulating layer in filling these narrow gaps, the bias potential is increased to induce a greater amount of sputter etching. Alternatively, a separate etching step may be performed.

One advantage of using ECR plasma deposition is that the substrate does not have to heated to more than 150 degrees C. Above about 400 degrees C., hillocks tend to form in the aluminum conductive lines and, if the growth is lateral, it could bridge the narrow gap between lines and create a short. Other plasma apparatus that can perform deposition and etching and operate at low substrate temperatures are a transformer coupled plasma (TCP) reactor and a helicon coupled plasma (HCP) reactor.

The description in the specification of both of these patents describes methods for forming void-free insulating layers between the conductive lines and they teach that, from a detrimental standpoint, voids will form in the narrow gaps under certain conditions.

SUMMARY OF THE INVENTION

It is an object of the present invention to provide a method for forming insulating layers on and between metal conductive lines such that the insulation in the narrow gaps between conductive lines has an improved dielectric constant.

Another object of the present invention is to provide a method for filling the narrow gaps between conductive lines with an effective insulating layer that has a lower dielectric constant than the dielectric constant of the other wider gaps between the conductive lines.

In accordance with the invention, silicon containing insulating material is deposited by chemical vapor deposition (CVD) with nonconform step coverage on a patterned surface of metal conductive lines with at least some number having narrow gaps so as to deposit the material under conditions such that a large closed void forms in each of the narrow gaps. At least one-third of the volume of the narrow gap is filled with the void so that the effective dielectric constant of the combined insulating material and the void is at about or below 3. In nonconformal step coverage, the deposition rate is proportional to the arrival angle of reactants being deposited. Along the top horizontal surface of the conductive lines, the reactants arrive from many angles varying from 0° to 180°, while reactants at the top or shoulder of the vertical walls of the conductive lines arrive from angles varying from 0° to 90°. Further down the wall within the gap, the angle of arrival is dependent on height (H) of the wall and the width (W) or distance of the gap between conductive lines and is proportional to arctan W/H. During deposition, due to nonconformal step coverage of the plasma reactants, only a thin layer of insulating material is being formed on the vertical walls of the conductive lines while the material on the top and shoulders of the conductive lines is initially being formed substantially thicker and, as it grows at this rate, it reduces the width (W) of the gap at the top of the conductive lines which, in turn, continues to reduce the deposition on the vertical walls until finally it bridges across the gap at the top. After the bridge of insulating material has formed across the narrow gaps and closes the voids within the gap, the deposition continues until a layer of insulating material is substantially above the conductive lines so as to close off any other voids forming outside of the gaps or openings between the conductive lines. Accordingly, with this method, narrow gaps equal to or less than 0.5 microns and with an aspect ratio of at least 2 to 1 are formed with closed voids in the gaps with about at least one-third of the volume of the gap consisting of a void. By using silicon containing gases which form nonconformal layers, it is possible to maximize the size of the void in the narrow gap and thereby minimize the effective dielectric constant of the resultant insulating material and void in the narrow gap or opening between the adjacent conductive lines and thereby lower the capacitance and the RC delay.

In accordance with another aspect of the present invention, a thin conformal layer is first deposited on the conductive lines so as to augment the subsequent thin nonconformal layer on the vertical walls as a barrier against the protrusions or hillocks when the conductive line is aluminum (Al).

It should be noted that the above described prior art patents not only fail to teach a method for forming a large closed void in each of the narrow gaps between the conductive lines, but fail to recognize and even teach away from the performance advantage that can be gained by such a large void in a narrow gap.

BRIEF DESCRIPTION OF THE DRAWINGS

The foregoing and other objects, aspects and advantages will be better understood from the following detailed description of a preferred embodiments of the invention with reference in the drawings, in which:

FIG. 1 is a plan view of a portion of a VLSI integrated circuit metallization layer during fabrication of a semiconductor chip prior to being covered with a layer of insulating material.

FIG. 2 is a cross-sectional view of the metallization layer taken along 2—2 of FIG. 1.

FIGS. 3, 4 and FIG. 5 are enlarged cross-sectional views of a section of FIG. 2 as indicated by vertical lines 3—3 and 3a—3a showing early, intermediate and final stages of a prior art method for coating an insulating layer on the metallization layer.

DETAILED DESCRIPTION OF THE PREFERRED EMBODIMENTS OF THE INVENTION

Figure 6:
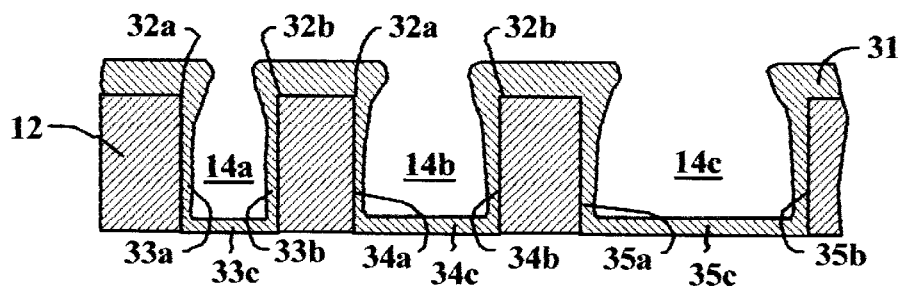
FIGS. 6, 7, 8, 9, 10 and 11 are enlarged cross-sectional views of the same section of FIG. 2 as in FIG. 3 showing early, intermediate and final stages of the method of the present invention for coating an insulating layer on the metallization layer.

Referring now to the drawings and, more particularly to FIGS. 1 and 2, a portion of a partially complete metallization layer 10 is shown disposed on an insulating layer 11 and with a plurality of conductive lines 12 having narrow gaps or openings 14a, intermediate gaps 14b and wide gaps 14c between the conductive lines. A cross-section of this metallization layer 10 is shown in FIG. 2 and it includes a conductive line 15 in the underlying metallization layer with vias 16a and 16b connecting that conductive line with two of the lines of the metallization layer 10. An insulating material must be deposited in the gaps or openings 14 as shown in FIGS. 1 and 2 to complete the metallization layer 10. Heretofore, this was accomplished by chemical vapor deposition (CVD) of precursors of the insulating material, such as silane ($SiH_4$) and oxygen ($O_2$). Because of smaller gaps, such as 0.5 microns or less, between the conductive lines 12 and the possible formation of a small voids in filling such narrow gaps, a present method uses the combination of simultaneously depositing and etching the insulating material to fill all of the gaps without any small voids. This method is shown in FIGS. 3, 4 and 5 at early, intermediate, and near final stages of filling the gaps 14a, 14b and 14c, respectively, between conductive lines 12 with a conformal insulating material 17, such as when the source of silicon is tetraethylorthosilicate (TEOS) or tetramethylcyclotetrasilane (TMCTS) to react with $O_2$. Either a single chamber plasma reactor or a dual chamber, such as a Electron Cyclotron Resonance (ECR) reactor, are used to simultaneously deposit $SiO_2$ and etch the deposited $SiO_2$ with either $O_2$ or Argon (Ar) providing ions for sputter etching or an etching gas, such as carbon tetrafluoride ($CF_4$) for chemical etching. In the prior method using an ECR reactor, a conformal $SiO_2$ layer is deposited anisotropically or unidirectionally parallel to the sidewalls of the conductive lines 12 so as to minimize any buildup of the deposited $SiO_2$ on the shoulders 18 of the conductive lines as best shown in FIGS. 3. In addition, the deposited $SiO_2$ is etched at approximately a 45° angle during deposition which causes the shoulders 17 to take on a sloped appearance as shown in FIGS. 3–5 and further reduces any possibility of deposited SiO$_2$ bridging over the gaps or openings 14a, 14b and 14c to create a void. Thus, the combination of conformal source material for the insulating layer, undirectional deposition, and angle etching provides void free insulation between and on top of the conductive lines 12. The dielectric constant of the insulation between the conductive lives is the sole dielectric constant of the deposited insulating material and, since it is SiO$_2$, the dielectric constant of the prior art insulating material between the narrow gap 14a is in the range of 3.5 to 4.

In accordance with the present invention, it has been discovered that a large void is not detrimental in filling a narrow gap or opening 14a because the void has a lower dielectric constant than any of the solid insulating materials, such as SiO$_2$, and the combination of the solid insulating material and a void of the proper size and position yields a dielectric constant of at least about 3 and lower. The void in a gap or opening of 0.5 microns or less with an aspect ratio of 2 to 1 or greater relative to the conductive line's height provides a substantial improvement in the capacitance of the gap and thereby the RC delay of the conductive lines 12a and 12b on either side of the gap 14a.

A method for achieving a void of the proper size and position is shown sequentially in FIGS. 6, 7, 8, 9, 10 and 11. As shown in FIG. 6, a nonconformal insulating layer 31, herein SiO$_2$, is CVD deposited using silane (SiH$_4$) as the source for silicon and nitrous oxide (N$_2$O) as a source for oxygen (O$_2$). The use of a nonconformal source material results in poor "step coverage". Step coverage, a measure of how well a film maintains its nominal thickness, is expressed by the ratio of the minimum thickness of a film as it crosses a step, $t_s$, to the nominal thickness of the film on horizontal regions, $t_n$, and it is expressed as the percentage of the nominal thickness that occurs at the step:

Step coverage $(\%)=(t_s/t_n)+100$

Figure 7:
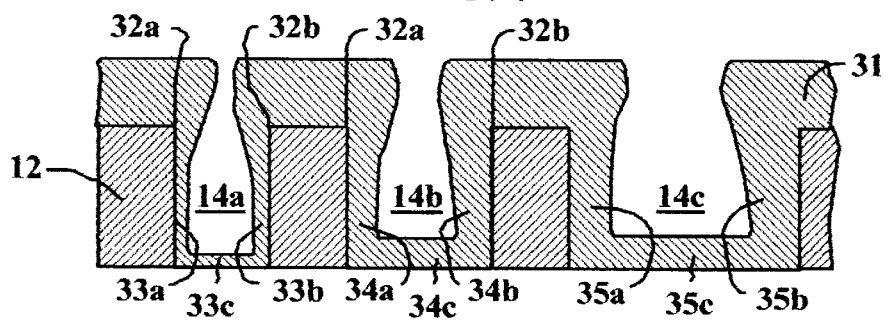
Figure 8:
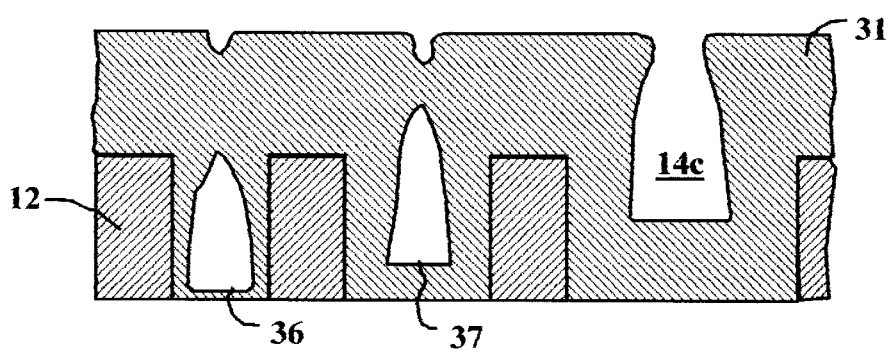

With a step coverage of less than 50%, the deposited SiO$_2$ forms a thick layer on the top or shoulders 32a and 32b of conductive lines 12 but only forms thin sidewalls 33a and 33b and a thin bottom layer 33c in the narrow gap or opening 14a, slightly thicker sidewalls 34a and 34b and bottom layer 34c in the intermediate gap or opening 14b, and even thicker sidewalls 35a and 35b and bottom layer 35c in the wide gap or opening 14c as shown in FIG. 6. As the deposition continues, the nonconformal characteristic of the deposition causes the top or shoulders 32a and 32b to grow thicker until at the narrow gap or opening 14a, they almost bridge together as shown in FIG. 7. Because of the restricted space between the shoulders 32a and 32b, the sidewalls 33a and 33b and the bottom layer 33c only slightly increase in thickness as shown in FIG. 7. With continued deposition in a nonconformal manner with a step coverage of not greater than 10 to 20%, the shoulders 32a and 32b of the narrow gap 14a finally bridge over and create a void 36 between the two conductive lines 12 which is positioned essentially below the top of the conductive lines as shown in FIG. 8. By being essentially below the top of the conductive lines 12, it will have the greatest impact on lowering the dielectric constant of the insulation between the conductive lines 12 on opposite sides of the narrow gap 14a. With continued CVD deposition in this nonconformal manner, the shoulders 32a and 32b of the intermediate gap 14b, which is greater than 0.5 microns but less than 1.0 micron, as shown in FIG. 8, also bridge over and forms a void 37 at a position at least one-third up the conductive lines 12. Although due to the position of the void being partially out of the gap and the overall size of the gap as shown in FIG. 8, the void 37 does not contribute to the same degree in lowering the dielectric constant of the insulation between the intermediate gap 14b as void 36 in the narrow gap 14a. However, since it will be substantially below the ultimate top of the insulating layer 31, it is not detrimental to the insulating layer.

As a specific example of the operating conditions for depositing the SiO$_2$ nonconformal layer, SiH$_4$ and nitrous oxide (N$_2$O) and nitrogen gas (N$_2$) are used in a commercially available multi-station parallel plate reactor. The SiH$_4$ flow rate is set at 200 sccm and the N$_2$O/N$_2$ flow rates are set to 6000 sccm and 3150 ssccm, respectively. The chamber pressure is 2.2 Torr and the wafer temperature is held at 400° C. A 1000 watts (W) of rf power at 13.5 MHz is applied to multiple top electrodes/gas showerheads. The power density is approximately 0.5W/cm$^2$. Under these conditions, a SiO$_2$ deposition rate of 4500 Å A/min is achieved.

Figure 9:
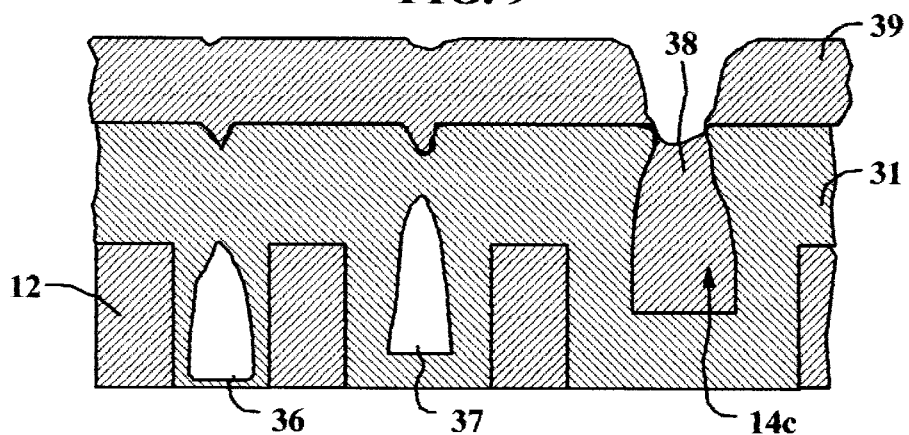
Figure 10:
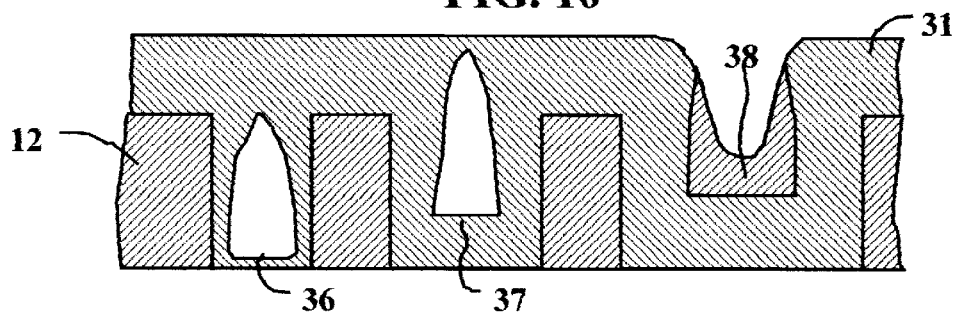
Figure 11:
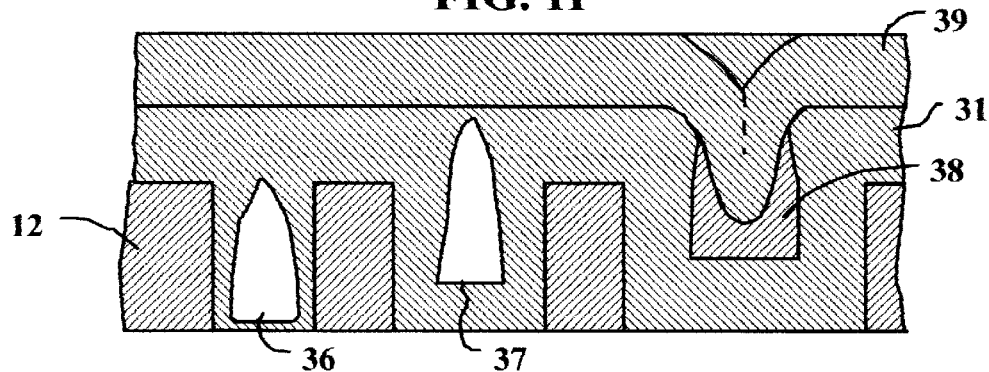

At this point, the deposition is stopped and the surface of the nonconformal layer 31 is spin coated with a spin on glass (SOG) 38 with planarization capability to flow into and fill the remaining gaps or openings, such as 14c as shown in FIG. 9. Although either siloxanes or silicates mixed in a solvent, such as alcohol, are useable, the siloxanes are preferred, and herein is methylsiloxane coated to a thickness of about 200 to 400 Å A and is dispensed from a commercially available spin coater. After being spun on, the SOG is baked first at a low temperature, 150°–250° C. for 1–15 minutes in air, followed by a higher temperature, 400°–425° C. for 30 to 60 minutes in air to drive off the solvent and cure the SOG to give it properties similar to SiO$_2$. After filling the remaining gaps or openings, such as 14c, the SOG 38 is removed with plasma etching with herein carbon tetraf loride (CF$_4$) from the surface of the nonconformal insulating layer 31 as shown in FIG. 10. The layer 31 is now covered with either a conformal or nonflowable, nonflowable insulating layer 39, herein plasma enhanced SiO$_2$ using TEOS in a commercially available plasma reactor to bring the combined insulating layer to about 0.8 to 1.2 microns and seal the SOG within the gaps, such as 14c. The surface of the conformal insulating layer 39 is then chem/mech polished using commercially available equipment and slurry to planarize the surface of layer 39 as shown in FIG. 11.

Figure 12:
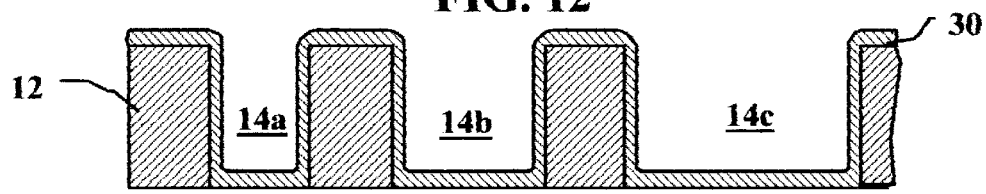
FIGS. 12, 13, 14, 15, 16, 17 and 18 are enlarged cross-sectional views of the same section of FIG. 2 as in FIG. 3 showing early, intermediate and final stages of another embodiment of the present invention.
Figure 13:
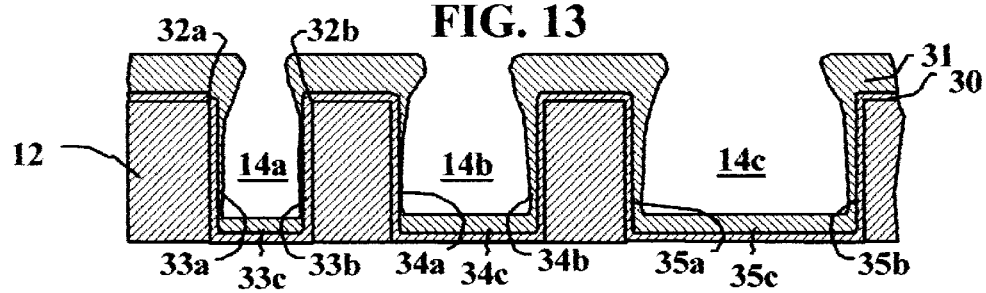
Figure 14:
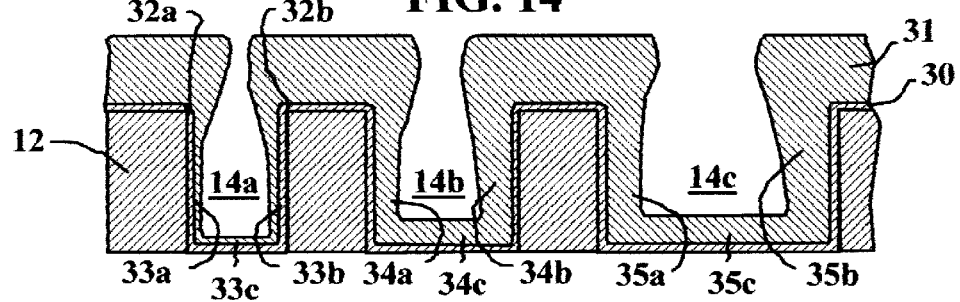
Figure 15:
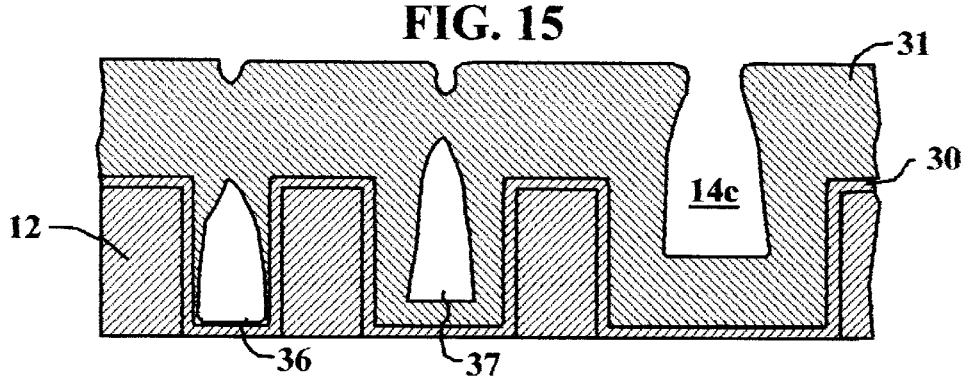
Figure 16:
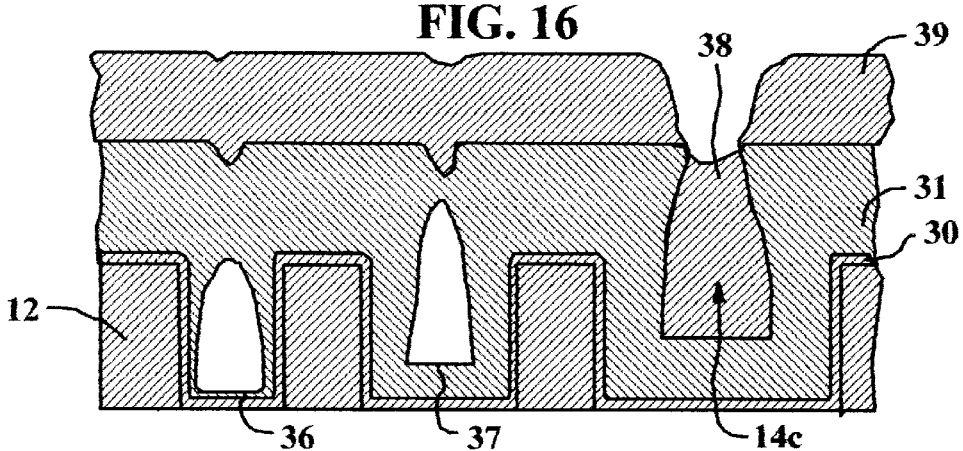
Figure 17:
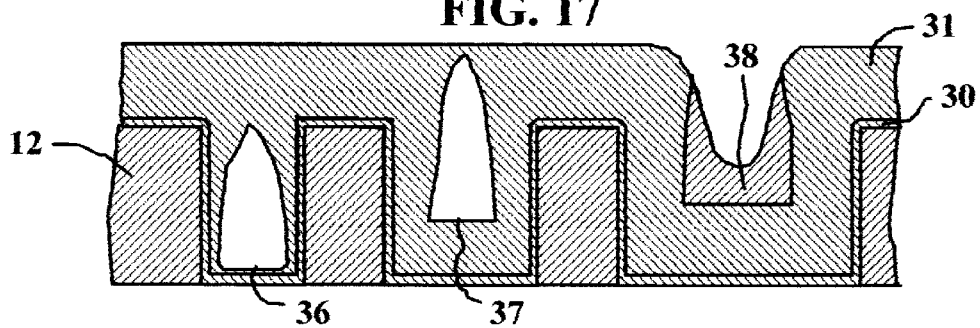
Figure 18:
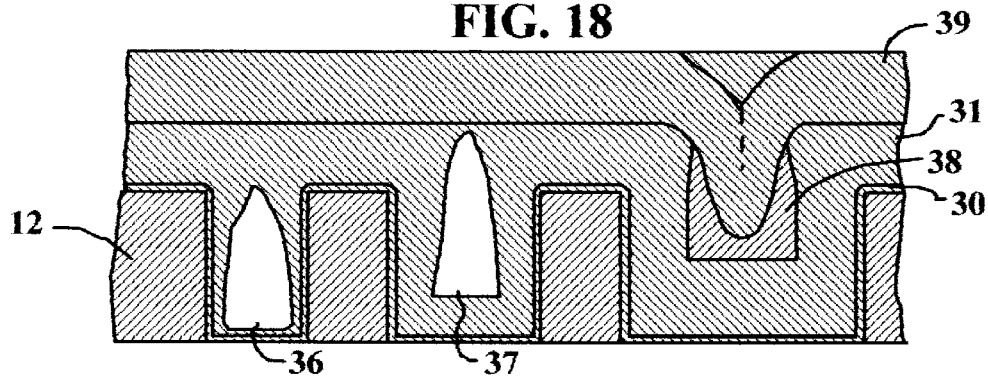

In another embodiment of the present invention, a thin conformal layer 30 is first deposited as a liner on the sidewalls of the conductive lines, and herein is about 500 Å A thick as shown in FIG. 12, as a safeguard against hillocks or protrusions from the conductive lines when the metal is aluminum (Al). In the present instant, SiO$_2$ is the conformal liner 30 and is deposited from a plasma reactor using TEOS as the conformal silicon source. A nonconformal deposition 31 is followed, as shown in FIG. 13, 14, and 15 and, since the gaps 14a, 14b, 14c are narrower and the conductive lines 12 higher with the conformal liner 30, the initial step coverage is below about 40% with same specific conditions described in the other embodiment. The remainder of this embodiment is the same as the above described embodiment without the conformal liner 30 and includes the coating and etch back of SOG 38 as shown in FIGS. 16 and 17, and the plasma enhanced deposited conformal layer 39 which is planarized by chem/mech polishing as shown in FIG. 18.

Although this invention has been described relative to specific insulating materials, conductive materials and apparatuses for depositing and removing these materials, it is not limited to the specific materials and apparatus but only to their specific characteristics, such as conformal and nonconformal, and other materials and apparatuses can be substituted as is well understood by those skilled in the microelectronics arts after appreciating the present invention.

We claim:

1. A method of depositing silicon containing insulating material on a patterned surface of metal conductive lines on a substrate separated by gaps, with at least one pair of said conductive lines with opposing walls having a narrow gap of about 0.5 microns or less between said walls and an aspect ratio of 2 to 1 or greater, comprising the steps of:

depositing a nonconformal silicon containing insulating material between the walls of the conductive lines under conditions to provide a poor step coverage between the bottom of the gap and the top of the conductive lines so that the material forms shoulders on the tops of the conductive lines and bridges across the lines with a gap of about 0.5 microns or less, thereby forming a void in said narrow gap having an effective dielectric constant of less than about 3;

filling remaining open gaps between the conductive lines by depositing a flowable insulating material on said nonconformal insulating material; and depositing a silicon containing insulating material on said nonconformal layer and over said flowable insulating material to complete the insulating layer between and over the conductive lines.

2. The method of claim 1 wherein said metal of the conductive lines is either aluminum or an aluminum alloy and a thin conformal layer of not greater than 500 Å A is deposited before the nonconformal insulating material is deposited.

3. The method of claim 1 wherein the silicon source of the nonconformal insulating material is silane.

4. The method of claim 1 wherein the initial step coverage is less than 50%.

5. The method of claim 1 wherein, during the formation of said void, the step coverage is not greater than 20%.

6. The method of claim 1 wherein said flowable insulating material is spin on glass.

7. The method of claim 6 wherein said spin on glass is a siloxane.

8. The method of claim 1 wherein any of said spin on glass on the nonconformal insulating material outside said gaps is removed.

9. The method of claim 1 wherein said conductive lines include lines with opposing walls having an intermediate gap greater than 0.5 microns but less than 1.0 micron, and a void is formed partially in the gap and partially out of the gap and above the conductive lines so as to lower the resultant dielectric constant of the insulation in the intermediate gap but not to a lesser degree than the void in the narrow gap.

* * * * *